United States Patent [19]

Anderson et al.

[11] Patent Number: 5,219,711
[45] Date of Patent: Jun. 15, 1993

[54] POSITIVE IMAGE FORMATION UTILIZING RESIST MATERIAL WITH CARBAZOLE DIAZONIUM SALT ACID GENERATOR

[75] Inventors: Albert G. Anderson, Wilmington, Del.; Walter R. Hertler, Kennett Square, Pa.; Robert C. Wheland; Yuan Yu G. Chen, both of Wilmington, Del.

[73] Assignee: E. I. Du Pont de Nemours and Company, Wilmington, Del.

[21] Appl. No.: 884,021

[22] Filed: May 18, 1992

Related U.S. Application Data

[60] Continuation of Ser. No. 591,124, Oct. 1, 1990, abandoned, which is a division of Ser. No. 508,134, Apr. 10, 1990, Pat. No. 4,985,332.

[51] Int. Cl.$^5$ .......................... G03F 7/30; G03F 7/38; G03F 7/021
[52] U.S. Cl. .................................. 430/296; 430/157; 430/163; 430/176; 430/311; 430/320; 430/326; 430/327; 430/330; 430/942
[58] Field of Search ............... 430/157, 175, 176, 296, 430/311, 320, 326, 327, 330, 942, 163; 526/320

[56] References Cited

U.S. PATENT DOCUMENTS

| | | | |
|---|---|---|---|
| 3,062,644 | 11/1962 | Neugebauer | 430/176 |
| 3,219,447 | 11/1965 | Neugebauer et al. | 430/163 |
| 3,779,778 | 12/1973 | Smith et al. | 430/270 |
| 4,491,628 | 1/1985 | Ito et al. | 430/176 |
| 4,546,160 | 10/1985 | Brand et al. | 526/320 |
| 4,686,547 | 8/1987 | Hayashi | 503/207 |
| 4,842,983 | 6/1989 | Hasegawa | 430/175 |
| 4,851,319 | 7/1989 | Walls et al. | 430/175 |
| 5,002,856 | 3/1991 | Anderson | 430/280 |
| 5,071,731 | 12/1991 | Chen et al. | 430/270 |
| 5,072,029 | 12/1991 | Hertler | 560/225 |
| 5,077,174 | 12/1991 | Bauer et al. | 430/270 |

FOREIGN PATENT DOCUMENTS

| | | |
|---|---|---|
| 672947 | 10/1963 | Canada . |
| 0264908 | 4/1988 | European Pat. Off. . |
| 118641 | 7/1983 | Japan . |

OTHER PUBLICATIONS

J. V Crivello, Polymeric Materials Science and Engineering Preprints, vol. 61, Amer. Chem. Soc. Mfg. FL Sep. 1989 pp. 62–66.

Kearns, et al., Journal of Macromolecular Science and Chemistry, A8(4), (1974), pp. 673–685.

*Primary Examiner*—Charles L. Bowers, Jr.
*Assistant Examiner*—Christopher G. Young

[57] ABSTRACT

Excellent resolution and sensitivity in the patterning of resists utilized in device and mask manufacture is obtained with a specific composition. In particular this composition involves polymers having recurring pendant acid labile α-alkoxyalkyl carboxylic acid ester and/or hydroxyaromatic ether moieties in the presence of an acid generator comprising a novel diazonium salt.

19 Claims, No Drawings

POSITIVE IMAGE FORMATION UTILIZING RESIST MATERIAL WITH CARBAZOLE DIAZONIUM SALT ACID GENERATOR

This is a continuation of Ser. No. 07/591,124 filed on Oct. 1, 1990 now abandoned which is a division of application Ser. No. 07/508,134, filed Apr. 10, 1990 U.S. Pat. No. 4,985,332.

BACKGROUND OF THE INVENTION

1. Field of the Invention

This invention relates to novel photoresist compositions for forming positive resist images on a surface and to device fabrication using such novel compositions. The instant composition contains polymers having pendant acid labile groups in the presence of acid generators comprising novel diazonium salts.

2. Art Background

Lithographic patterning of circuit components has become useful in the field of device fabrication, e.g., semiconductor device fabrication, interconnection media such as printed circuit boards, and optoelectronic device fabrication. (See, for example, C. Grant Willson and Murrae J. Bowden, "Resist Materials For Microelectronics," ChemTech, pages 102-111 (Feb. 1989.) Such processes involve the fabrication of devices or patterned regions on a substrate such as a semiconductor substrate, e.g., silicon or on a chromium coated mask substrate. (Substrate in the context of this invention refers to the wafer, board or mask on which the device or pattern is being formed and includes in the former case, if present, regions of semiconductor material, dielectric material, and electrically conducting material or in the latter case, optically transmitting material.) The fabrication procedure generally requires at least one step in which a resist material is formed on the substrate and a pattern is delineated in this material by exposure to correspondingly patterned, actinic radiation, e.g., deep ultraviolet radiation (150 to 300 nanometers), x-radiation (0.4 to 10 nanometers), ultraviolet radiation (300 to 400 nanometers), visible radiation (400 to 700 nanometers) and particle beams such as ion and electron beams. The actinic radiation produces a chemical reaction in the film which in turn introduces a difference in solubility between the exposed and unexposed regions. The exposed pattern in the resist is developed with a suitable solvent that preferentially solubilizes the exposed or unexposed region. The pattern thus produced in the resist material is employed as a protective barrier in subsequent device fabrication steps such as etching, ion implantation, deposition and dopant diffusion or employed as a protective barrier for etching mask substrates.

Various resist materials relying on a wide variety of chemistries have been proposed for use in device fabrication. One such approach is discussed in U.S. Pat. No. 3,779,778. This approach employs a water insoluble polymer containing one or more acid degradable groups and a photosensitive acid generator. Examples of photoacid generating compounds are described in a paper by J. V. Crivello, "The Chemistry of Photoacid Generating Compounds" in Polymeric Materials Science and Engineering Preprints, Vol. 61, Amer. Chem. Soc. Meeting, Miami, Fla., Sept. 11-15, 1989, pp. 62-66 and references therein. The crux of this approach involves the use of a radiolytic acid generator and a polymer whose pendant groups are chosen to be catalytically acid labile; thus, the polymer is disclosed to contain one or more acid degradable linkages which are formed by the nucleophilic reaction of hydroxy aromatic compounds, N-alkylaryl sulfonamides or certain secondary amines with alkyl vinyl ether such as methyl vinyl ether, ethyl vinyl ether or dihydropyran. (As to this last embodiment, the reactions of dihydropyran materials as protecting groups removed by relatively mild conditions are described by J. E. Kerns et al., *Journal of Macromolecular Science and Chemistry*, A8(4), 673 (1974)). (See also Canadian Patent No. 672,947).

U.S. Pat. No. 4,491,628 also discloses resist materials sensitive to ultraviolet, deep ultraviolet, electron beam and x-ray radiation employing an acid generator with a polymer having acid labile pendant groups. The polymers include recurrent pendant groups such as tertiary butyl ester or tertiary butyl carbonate groups together with a generator of acid that catalytically converts the protecting moiety to an aqueous base solubilizing group. (A sensitizer that alters wavelength sensitivity also is discussed.) The preferred acid labile pendant groups are tertiary butyl esters of carboxylic acids and tertiary butyl ethers and carbonates of phenols. However, other acid labile groups such as trityl, benzyl, benzylhydryl as well as others characterized as "well known in the art" are discussed.

In a third resist employing an acid generator and polymer combination (European Patent Application 0264908) the auto decomposition temperature of the polymer, copolymer or terpolymer employed is increased to greater than 160° C. by employing pendant groups that form secondary carbonium ion intermediates with an available adjacent proton.

In other approaches to resist chemistries, a polymer (without radiation sensitive acid generator) is formulated to have a backbone and pendant group that together yield the desired properties. Such material described in Japanese Kokai No. SH057 [1983] 118641 includes a methyl methacrylate backbone and alkoxyalkyl pendant groups. Presently a desirable formulation goal for any photoresist is a sensitivity better than 30 mJ/CM$^2$ for utility in the deep ultraviolet range, and better than 10 $\mu$C/cm$^2$ for use with electron radiation, with a resolution better than 1.0 $\mu$m.

Co-pending U.S. Ser. No. 07/388,404 filed on Aug. 2, 1989 discloses thermally stable carbazole diazonium salts and is incorporated herein in its entirety.

Co-Pending U.S. Ser. No. 07/507,342 discloses a resist material and process of use. The resist material and process does not teach the specific carbazole diazonium salt acid generator taught herein.

SUMMARY OF THE INVENTION

The present invention involves the fabrication of devices utilizing a resist formulation that includes an acid generator and a polymer that possess recurring acid labile groups including $\alpha$-alkoxyalkyl esters of carboxylic acids and/or $\alpha$-alkoxyalkyl ether derivatives of hydroxyaryl or hydroxyaralkyl esters of carboxylic acids.

The invention provides resist materials which are capable of being activated with actinic radiation, e.g., deep ultraviolet radiation, x-radiation, ultraviolet radiation, visible radiation and particle beams such as ion and electron beams comprising (1) a polymer chosen from the group consisting of compositions having a polymer backbone and pendant acid labile groups which are bound directly or indirectly to the polymer backbone, said pendant acid labile groups represented by the formula:

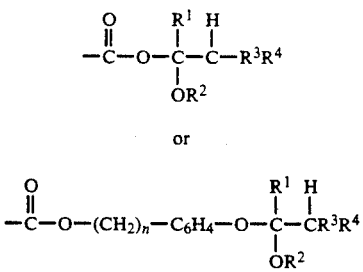

or

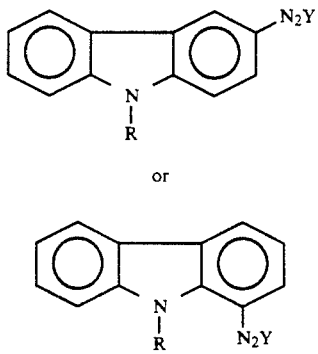

wherein:

n=0–4;

$R^1$ is hydrogen or lower alkyl (alkyl having up to 6 carbon atoms);

$R^2$ is lower alkyl (alkyl having up to 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6- or 7-membered ring, and a carbazole diazonium salt of the structure:

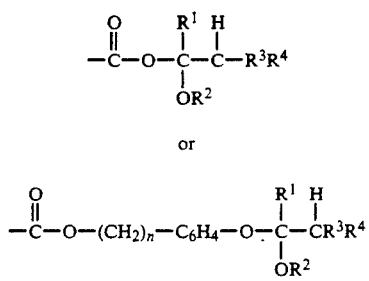

wherein:

Y is $PF_6^-$, $AsF_6^-$, $SbF_6^-$, $FeCl_4^-$, $SnCl_6^{-2}$, $SbCl_6^-$, $BF_4^-$ or $BiCl_5^{-2}$; and R is selected from the group consisting of $C_xH_{2x+1}$ where x is 1–16, benzyl, phenyl, substituted benzyl, substituted phenyl and cycloalkyl, provided, however, where $N_2Y$ is in the "1" position as in the second structure, R is not phenyl or substituted phenyl.

DETAILED DESCRIPTION OF THE INVENTION

An especially important property of a resist composition, or of substrate having a layer of the resist composition adhered thereto, is the property of long-term stability. The property is often referred to as pot life of a not-yet-applied resist composition or as shelf life of an article to which a resist composition has been applied. The terms pot life or shelf life are not unique to resist composition technology, but are widely used in many areas of technology where a resin-based composition is used.

One source of instability in a resist composition that comprises a polymer is the instability of the acid generator. This can result in a premature, prior-to-exposure, at-least-partial release of acid. This can lead to the generation of a false image, the generation of "fog", or the generation of "background". One method of avoiding these difficulties is by utilizing an incident radiation sensitive acid generator that possesses a high degree of stability.

Excellent, shelf life resolution and sensitivity are obtained in device and mask fabrication by utilizing specific resins in conjunction with the radiolytic acid generator of the present invention. Such resins involve a polymer backbone such as methacrylate, acrylate, or styrene backbone having pendant acid labile groups which are bound directly or indirectly to the polymer backbone described as:

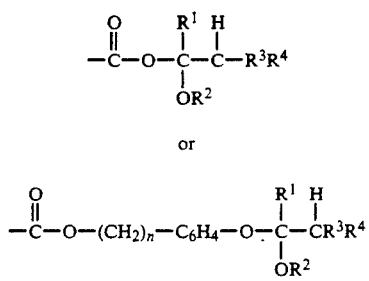

wherein n=0–4;

$R^1$ is hydrogen or lower alkyl (alkyl having up to 6 carbon atoms);

$R^2$ is lower alkyl (alkyl having up to 6 carbon atoms); and $R^3$ and $R^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6-, or 7-membered ring, and a carbazole diazonium salt of the structure:

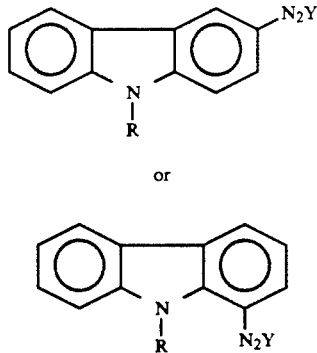

wherein:

Y is $PF_6^-$, $AsF_6^-$, $SbF_6^-$, $FeCl_4^-$, $SnCl_6^{-2}$, $SbCl_6^-$, $BF_4^-$ or $BiCl_5^{-2}$; and R is selected from the group consisting of $C_xH_{2x+1}$ where x is 1–16, benzyl, phenyl, substituted benzyl, substituted phenyl and cycloalkyl, provided, however, where $N_2Y$ is in the "1" position as in the second structure, R is not phenyl or substituted phenyl.

Exemplary of resins utilized in these resist compositions are copolymers of benzyl methacrylate and tetrahydropyranyl methacrylate, and polymers of 4-tetrahydropyranyloxybenzyl methacrylate (or acrylate).

The concentration of the previously described acid labile pendant groups is dependent on the structure and acidity of the polymeric acid species formed. For methacrylic acid forming systems the ratio of acid labile to non-acid labile groups should be at least one moiety per twenty (hydrophobic groups). Ratios less than approximately 5% lead to material that is insoluble in aqueous alkali while ratios greater than 20% in the resin generally lead to rapid development. A control sample is easily employed to determine suitable concentrations for a desired group. Additionally, the concentration of the pendant group together with the particular pendant groups employed should be chosen so that after exposure, a volume loss of less than 25% is incurred. (Volume loss is measured by layer thickness changes.) For volume losses greater than 25%, image distortion is possible. Groups such as tertiarybutylcarbonyloxy afford volatile products which in turn produce relatively large volume changes upon exposure and subsequent thermal processing to complete the reaction. Groups such as tetrahydropyranyloxy attached to aromatic acrylic polymers and present in only one monomer of a copolymer or terpolymer afford volume changes less than 25% after exposure and further processing.

The molecular weight of the resin material should generally be in the range of 5,000 to 500,000 g/mole. Molecular weights less than 5,000 g/mole lead to poor film formation characteristics and too rapid dissolution of the base-soluble form, while molecular weights greater than 500,000 g/mole lead to solutions with too high viscosity and poor dissolution characteristics upon exposure and processing. The polydispersity of the polymer $M_w/M_n$ should be less than 1.75. Polydispersities greater than 1.75, although not precluded, generally lead to decreased lithographic reproducibility. Additionally, solutions of the material should be of suitable viscosity, generally in the range of 10 to 500 cp, to form an essentially pinhole-free, continuous coating on the substrate with thicknesses in the range of 0.5 to 2.0 $\mu$m. For example, in the case of a silicon based substrate, the polymers forming resist layers thinner than 0.5 $\mu$m are difficult to maintain pinhole-free, while layers thicker than 2.0 $\mu$m are difficult to coat uniformly. These resists are sensitive to actinic radiation, e.g., deep ultraviolet radiation, x-radiation, ultraviolet radiation, visible radiation and particle beams such as ion and electron beams.

Pendant groups of the generic formulae above are attached to the polymer backbone or are directly or indirectly pendant from the polymer backbone. Examples of attachment points are: 1) the carbon atom in the α-position relative to the carboxylic acid group in acrylic or methacrylic polymers; and 2) the carbon atom in the benzene ring of polystyrene that is para- to the point of polymer backbone attachment.

Although the specific backbone employed in the resin is not critical for most applications, methacrylates, acrylates and styrenes are advantageously used in deep ultraviolet radiation applications since they generally yield materials with relatively low optical densities needed for high resolution in spectral regions suitable for exposure, e.g., 248 nm. Typically optical densities for the resins of greater than 0.30 per $\mu$m are undesirable. For suitable resolution, resist thicknesses in the range 0.8 to 1.2 $\mu$m are employed in device fabrication while thinner 0.2–0.5 $\mu$m films are adequate for mask fabrication. If the optical density of the resin is greater than 0.30 per $\mu$m, a uniform optical exposure through the thickness of such materials is not generally attained and resolution is degraded.

The specific pendant group within the generic class described also affects resist properties. For example, if the resist is to be employed as a mask in a plasma etching procedure, it is desirable to include aromatic moieties such as phenyl groups which offer relatively high resistance to typical plasma etchants such as $Cl_2$ and $CHF_3$. Similarly, if adhesion is more desirable than etch resistance, another moiety also is employed.

It is also possible to modify resist properties by employing a backbone polymer that is a copolymer, terpolymer or block copolymer of various monomers. For example, typically monomers such as methyl methacrylate, butyl methacrylate, benzyl methacrylate, benzyl acrylate and styrene as well as small amounts (typically less than 5 mole percent) of glycidyl methacrylate as an adhesion promoter are usefully employed. However, monomers that have very easily hydrolyzed or thermally cleaved functional groups should be avoided because of thermal instability.

The acid-labile resins utilized in the invention are typically formed by polymerization of monomeric components that contain the acid-labile group such as a monomeric acid-labile carboxylic acid ester that has been formed by the reaction of a monomeric carboxylic acid with an alkyl vinyl ether such as ethyl vinyl ether or a cyclic vinyl ether such as dihydropyran or a monomeric acid-labile alkoxy aryl ester (or alkoxyaralkyl ester) of a carboxylic acid that has been formed by the reaction of a hydroxyl aryl ester (or hydroxyaralkyl ester) of a carboxylic acid with an alkyl vinyl ether such as ethyl vinyl ether or a cyclic vinyl ether such as dihydropyran. Alternatively, reaction of polymer bound carboxylic acids with vinyl ethers in the presence of an acid catalyst or the reaction of the hydroxyl groups of polymer bound hydroxy aryl esters (or hydroxyaralkyl esters) of carboxylic acids with vinyl ethers in the presence of an acid catalyst is employed.

The polymers employed in the present invention are advantageously produced from the above described monomers by a polymerization reaction such as group transfer polymerization described in U.S. Pat. No. 4,417,034, free radical polymerization or other polymerization methods such as anionic polymerization. Group transfer polymerization produces highly reproducible nearly monodisperse (polydispersity less than 1.75) materials and thus generally leads to better control of the subsequent lithographic and device fabrication processes than materials produced by other polymerization procedures. Nevertheless, other polymerization processes are not precluded. Group transfer polymerization is particularly adapted to the polymerization of methacrylate and acrylate monomers which, as previously discussed, yield resins of suitable properties. The molecular weight of the polymer is dependent on the ratio of monomer to initiator.

Polydispersity $M_w/M_n$ is predominantly dependent on the polymerization conditions. Polydispersity is defined as the ratio of weight average molecular weight over number average molecular weight.

Methods for controlling polydispersity in GTP have been thoroughly discussed in I. B. Dicker et al., Polym. Prepr., *Am. Chem. Soc. Div. Polym. Chem.*, 1987, 28(1), 106.

The weight percentage of the photolytic acid generator relative to the resin in the polymer should generally be as low as possible without unacceptably sacrificing sensitivity. Weight percentages less than 0.1 lead to insensitive compositions while weight percentages greater than 5.0 tend to yield compatibility and control problems and cost increases. Further, it is possible to add other monomers or additives such as plasticizers into the resist composition to modify certain properties. Clearly it is contemplated that the acid generator undergo acid formation upon exposure to actinic radiation.

The resist film is initially formed by a variety of techniques such as those described in *Semiconductor Lithography*, by W. M. Moreau, Plenum Press, New York, 1988. Typically, the resin and acid generator are dissolved in solvents such as cyclopentanone. Typical resin concentrations in the solvent of 10 to 20 wt % are used to give approximately 1 μm thickness films. For methods such as spincoating the solution is generally placed on the wafer and the wafer is spun at a rate of 1000 to 6000 rpm.

For thicker film applications, after the resist is formed on the substrate, it is desirable although not essential to prebake the material. This prebake is conveniently performed in the temperature range 70° to 130° C. for periods in the range ½ to 30 min. The temperature and time period are adjusted to obtain enhanced sensitivity and resolution. It is also desirable but not essential to bake the exposed resist material after exposure but before development to augment the acid catalyzed removal of the protecting group. Typically temperatures in the range 70° to 115° C. in conjunction with time periods in the range 0.5 to 5 min are employed. These parameter ranges are employed to yield complete conversion of the protecting group to the acidic compound. Particular time period and temperature ranges are affected by the resin composition and the nature of the protecting group. With some compositions, no post-bake is required.

After exposure and optional post-bake, the exposed portion has a different solubility from those portions that were not subjected to actinic radiation. Generally a solvent is employed to develop the exposed material that is preferentially dissolved and leaves the unexposed portion of the resist material essentially untouched. For resins forming acidic groups upon exposure aqueous base developers are employed. Aqueous-base solutions such as 0.25 wt % tetramethylammonium hydroxide in water are preferred since they avoid typical disposal problems associated with organic solvents and develop the patterns without appreciable swelling.

After the photosensitive region is developed the resulting pattern is useful as an etching mask or for other conventional processing steps utilizing a delineated resist pattern such as ion implanation. After use, the resist material is typically removed with a suitable solvent stripper such as methyl ethyl ketone.

The following examples are illustrative of the invention.

POLYMER PREPARATION

Experiment 1

Preparation of 1:1 Random Copolymer of Tetrahydropyranyl Methacrylate and Benzyl Methacrylate by Group Transfer Polymerization To a solution of 0.74 mL (2.5 mmol) of 1-(2-trimethylsiloxyethoxy)-1-trimethylsiloxy-2-methyl-1-propene (TTEB) and 50 μL of tetrabutylammonium biacetate hexahydrate (0.04M in tetrahydrofuran) in 75 mL of tetrahydrofuran (THF) under argon was added a mixture of 25 mL (25.43 g, 0.1445 mol) of benzyl methacrylate and 24 mL (24.57 g, 0.1445 mol) of tetrahydropyranyl methacrylate (THPMA) at a rate such that the temperature did not exceed 38.2° C. Both monomers had been individually passed over columns of basic alumina under an argon atmosphere just prior to use. NMR analysis of an aliquot of the reaction mixture showed no residual monomer. The product was precipitated in methanol and dried at room temperature to give 47.6 g of poly(THPMA, benzyl methacrylate). GPC: $M_n=19,500$, $M_w=22,000$, $M_w/M_n=1.13$ (polystyrene standard). NMR analysis of the copolymer shows the composition to be 1:1 on a molar basis. In a similar experiment in which the quantity of monomers, initiator and catalyst were decreased to 60% of the above amounts, 1:1 copolymer was obtained with $M_n=19,2000$, $M_w=21,000$, $M_w/M_n=1.096$.

Experiment 2

Preparation of Homopolymer of Tetrahydropyranyl Methacrylate

To a solution of 0.30 mL (1 mmol) of TTEB and 25 μL of tetrabutylammonium biacetate hexahydrate (0.04M im THF) under argon in 75 mL of THF was added 20 g (19.6 mL, 0.1175 mol) of THPMA, that had been purified over a column of basic alumina just prior to use, at a rate such that the temperature did not exceed 40° C. NMR analysis of an aliquot of the solution showed that there was no residual monomer. Precipitation in methanol followed by drying in a vacuum oven at room temperature gave 19.9 g of poly(THPMA). GPC: $M_n=19,300$, $M_w=21,100$, $M_w/M_n=1.093$. Differential scanning calorimetry shows a Tg at 91° C.

Experiment 3

Preparation of 1:1 Random Copolymer of Tetrahydropyranyl Methacrylate and Benzyl Methacrylate To a solution of 12 mL of THPMA and 12.5 mL of benzyl methacrylate (both monomers purified separately over basic alumina) in methyl ethyl ketone (degassed with nitrogen) under argon at 75° C. was added 0.15 g of azobisisbutyronitrile ("VAZO 64"). After a total reaction time of 11.5 hr and a total VAZO 64 catalyst addition of 0.3 g, precipitation in hexane gave 22.2 g of poly(THPMA, benzyl methacrylate). NMR analysis of an aliquot of the reaction mixture showed 92% conversion. GPC: $M_n=20,000$, $M_w=48,700$, $M_w/M_n=2.433$.

Experiment 4

Preparation of Poly(4-tetrahydropyranyloxybenzyl methacrylate)

A. Preparation of Methyl 4-Tetrahydropyranyloxybenzoate

To a stirred mixture of 157 mL (1.72 mol) of 3,4-dihydro-2H-pyran, 300 mL of methylene chloride and 131 g (0.86 mol) of methyl 4-hydroxybenzoate was added 5 drops of 20% sulfuric acid. Addition of the acid caused the ester to dissolve and the temperature to rise 6° C. After sitrring for 20 hr, the solution was evaporated, and the residue was dissolved in ether and passed through a short column of basic alumina. The effluent was evaporated to small volume, and 144.7 g of methyl 4-tetrahydropyranyloxy benzoate crystallized as off-white solid, m.p. 70° C. $^1$H NMR (360 MHz, CDCl$_3$, d ppm, J in Hz): 1.5-2.1 (m's, 6H, CH$_3$), 3.87 (s, 3H, OMe), 5.49 (t, J=3.6, 1H, OCHO), 7.06 (d, J=9, 2H, ArH), 7.97 (d, J=9, 2H, ArH).

IR (CCl$_4$): 1722 cm$^{-1}$ (ester C=O).

B. Preparation of Tetrahydropyranyloxybenzyl Alcohol

To a mechanically stirred slurry of 10 g of lithium aluminum hydride and 100 mL of tetrahydrofuran was added dropwise with cooling in an ice bath a solution of 32.9 g (0.139 mol) of methyl 4-tetrahydropyranyloxy benzoate at a rate such that the temperature did not exceed 30° C. After stirring 18 hr at room temperature, the solution was treated cautiously with 100 mL of water. The mixture was filtered, and the filtrate was stirred with 200 mL of aqueous sodium hydroxide for 2 hr. The organic layer was separated and evaporated with a rotary evaporator. The residue was dissolved in 200 mL of ether and washed three times with 5% aqueous sodium bicarbonate and dried over sodium sulfate. Evaporation gave 20.58 g of 4-tetrahydropyranyloxy benzyl alcohol as a liquid.

$^1$H NMR (360 MHz, THF-d$_8$): 1.45-2.0 (m's, 6H, CH$_2$), 3.5 (m, 1H, OCH$_2$), 3.8 (m, 1H, OCH$_2$), 4.25 (t, J=6, 1H, OH), 4.45 (d, J=6, 2H, ArCH$_2$OH), 5.35 (t, J=3, 1H, OCHO), 6.95 (d, J=8, 2H, ArH), 7.19 (d, J=8, 2H, ArH).

IR shows no ester C=O absorption.

C. Preparation of 4-Tetrahydropyranyloxybenzyl Methacrylate

To a stirred solution of 62.4 g (0.3 mol) of 4-tetrahydropyranyloxy benzyl alcohol and 58.5 mL of triethylamine in 225 mL of methylene chloride and 225 mL of diethyl ether cooled in an ice bath was added dropwise 31.9 mL (0.33 mol) of methacrylyl chloride at a rate such that the temperature did not exceed 30° C. After 3.5 hr, the mixture was filtered, and the filtrate was evaporated. The residual oil was treated with ether and triethylamine and washed with water. The organic layer was dried (sodium sulfate) and evaporated to a yellow oil, which, on standing, gradually crystallized. The crystals were rinsed with a small amount of methanol to give 7.3 g of colorless crystals, m.p. 36°-36.7° C. The product can be recrystallized from hexane at low temperature.

$^1$H NMR (360 MHz, THF-d$_8$): 1.5-1.82 (m's, 6H, CH$_2$), 1.90 (m, 3H, CH$_3$C=), 3.5 (m, 1H, OCH$_2$), 3.8 (m, 1H, OCH$_2$), 5.07 (s, 2H, ArCH$_2$OOC), 5.40 (t, J=3, 1H, OCHO), 5.52 (m, 1H, =CH), 6.05 (m, 1H, =CH), 7.0 (m, 2H, ArH), 7.27 (m, 2H, ArH).

IR (CCl$_4$): 1720 cm$^{-1}$ (conj. ester C=O), 1640 cm$^{-1}$ (C=C).

D. Preparation of Poly(4-tetrahydropyranyloxybenzyl methacrylate)

After purification by passage of a solution in hexane over a short column of basic alumina, 14.45 g (52.3 mmol) 4-tetrahydropyranyloxybenzyl methacrylate, was dissolved in 45 mL of THF, and then treated 0.4 mL (2.42 mmol) of bis(dimethylaminomethylsilane (scavenger). After stirring for 30 min, 0.101 mL (0.503 mmol) of 1-methoxy-1-trimethylsiloxy-2-methyl-1-propene and 20 μL of tetrabutylammonium m-chlorobenzoate (0.3M in THF) were added. Since no exothermic polymerization was observed, an additional 40 μL of tetrabutylammonium m-chlorobenzoate (0.3M in THF) was added. A temperature rise of 6° C. occurred during 25 min. When the temperature had returned to room temperature, the reaction was quenched with 1 mL of methanol. Addition of the reaction mixture to 500 mL of methanol caused precipitation of 12.64 g of poly(4-tetrahydropyranyloxybenzyl methacrylate) as a colorless solid. GPC (polystyrene standard):

$M_n$ = 23,300, $M_W$ = 28,900, $M_W/M_n$ = 1.24.

$^1$H NMR (360 MHz, THF-d$_8$: 0.75 m 0.95, 1.15 (br s, 3H, CH$_3$) 1.45-2.05 (br m's, 8H, CH$_2$), 3.51 (m, 1H, OCH$_2$), 3.80 (m, 1H, OCH$_2$), 4.84 (br s, 2H, ArCH$_2$O), 5.40 (m, 1H, OCHO), 7.01 (m, 2H, ArH), 7.23 (m, 2H, ArH).

The tactic composition estimated from the $^1$H methyl resonance intensities is 54% rr, 43% rm, and 3% rr.

IR (nujol): 1730 cm$^{-1}$ (unconjugated ester C=O).

UV (glyme): 225 nm ($\epsilon$11,466), 272 nm ($\epsilon$1053), 278 nm ($\epsilon$903).

DSC: Tg=79.8° C.

Experiment 5

Preparation of 9-Ethyl-3-Carbazolediazonium Hexafluoroantimonate

A solution containing 3-amino-ethyl carbazole (5 g, 24 mmole) in 30 ml of glacial acetic acid was cooled to 15° C. To the cooled solution was added 1.7 g of NaNO$_2$ in 3 ml of water. The solution was stirred for 3 minutes. NaSbF$_6$ (6.16 g, 24 mmole) in 10 ml of water was added to the solution resulting in formation of a green-yellow precipitate. The slurry was diluted with 100 ml of water, stirred and filtered. The filtered solid was washed with 4×50 ml of water then with a solution of 1 gram of sulfamic acid in 15 ml of H$_2$O, and dried by vacuum filtration. The dried solid was dissolved in 70 ml of acetonitrile. Charcoal, 3 tablespoons, was added to the solution, stirred and filtered. To the clear filtrate was added 700 ml of diethyl ether to precipitate the yellow diazonium salt. The salt was collected by filtration and dried. Yield 6.48 grams.

$^1$H NMR (DMSO-d$_6$): 9.54 (s, C$_4$, 1H) 8.62 (d, C$_2$, 1H), 8.37 (d, C$_1$, 1H), 8.17 (d, C$_8$1H), 7.92 (d, C$_5$, 1H), 7.75 (t, C$_6$, 1H), 7.53 (t, C$_7$, 1H), 4.63 (q, CH$_2$, 2H), 1.40 (t, CH$_3$, 3H).

IR (nujol mull): 2215 cm$^{-1}$ (N$_2$+), 615 cm$^{-1}$ (SbF$_6^-$).

EXAMPLE 1

A mixture of 2.0 g of a 1:1 benzyl methacrylate/tetrahydropyranyl methacrylate copolymer, 0.050 g of 9-ethyl-3-carbazolediazonium hexafluoroantimonate, and 10.5 ml of methyl ethyl ketone was roll milled together for approximately 15 minutes and then filtered through a 0.45μ aerodisc ® filter to yield a clear solution. The solution was spin coated on a chromed glass mirror to give a homogeneous film approximately 1.5μ thick. Areas of 1 mm$^2$ were irradiated with 10 keV electrons using an electron microscope. After an exposure of 1 μC/cm$^2$, 0.1N aqueous tetramethyl ammonium hydroxide removed the exposed polymer down to glass within 30 seconds with negligible effect on the unexposed areas.

As many differing embodiments of this invention may be made without departing from the spirit and scope thereof, it is to be understood that this invention is not limited to the specific embodiments exemplified except as defined by the appended claims.

What is claimed is:

1. A process for making a device or mask comprising the steps of:
   (i) forming a material on a substrate, wherein said material comprises:
      (a) a polymer chosen from the group consisting of compositions having a polymer backbone and pendant groups bound directly or indirectly to said backbone, said pendant groups represented by the formula:

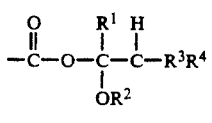

or

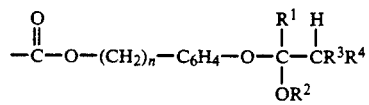

wherein:
n=0-4;
$R^1$ is hydrogen or a $C_1$-$C_6$ alkyl;
$R^2$ is a $C_1$-$C_6$ alkyl; and
$R^3$ and $R^4$ independently are hydrogen or $C_1$-$C_6$ alkyl where the definition of $C_1$-$C_6$ alkyl includes the joining of $R^1$ and $R^2$ or $R^1$ and either $R^3$ or $R^4$, or $R^2$ and either $R^3$ or $R^4$ to form a 5-, 6- or 7-membered ring; and (b) material that forms an acid upon irradiation comprising carbazole diazonium salts of the structures:

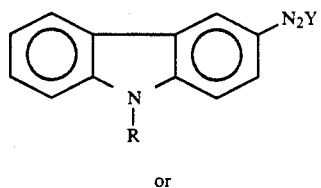

or

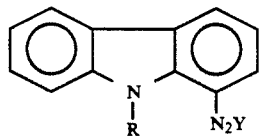

wherein:
Y is $PF_6^-$, $AsF_6^-$, $SbF_6^-$, $FeCl_4^-$, $SnCl_6^{-2}$, $SbCl_6^-$, $BF_4^-$ or $BiCl_5^{-2}$; and
R is selected from the group consisting of $C_xH_{2x+1}$ where x is 1-16, benzyl, phenyl, substituted benzyl, substituted phenyl and cycloalkyl, provided, however, where $N_2Y$ is in the "1" position as in the second structure, R is not phenyl or substituted phenyl;

(ii) irradiating part of said material with actinic radiation in order to delineate a latent image of a desired pattern on the irradiated part of the material; and
(iii) developing said irradiated and delineated material by means of a solvent that preferentially dissolves the irradiated material.

2. The process of claim 1 wherein the material is formed on the substrate by dissolving the material in a solvent then applying the solution to the substrate.

3. The process of claim 2 wherein the solution is spincoated to the substrate.

4. The process of claim 1 involving the additional step of prebaking the the material formed on substrate prior to the irradiation step (ii).

5. The process of claim 4 wherein the prebaking is done at a temperature of 70° C. to 130° C. for from 0.5 minutes to 30 minutes.

6. The process of claim 1 wherein said polymer comprises a copolymer, terpolymer or block polymer.

7. The process of claim 6 wherein said material comprises a copolymer of benzyl methacrylate.

8. The process of claim 6 wherein a monomer used to form said copolymer, terpolymer or block polymer comprises tetrahydropyranyl methacrylate.

9. The process of claim 1 wherein said polymer comprises a homopolymer of 4-tetrahydropyranyloxybenzyl methacrylate.

10. The process of claim 1 wherein said polymer is selected from the group consisting of methacrylates, acrylates, and polystyrenes.

11. The process of claim 10 wherein said polymer comprises a polystyrene and said pendant acid labile group is bound to said polymer backbone at a carbon atom of a benzene ring of said polystyrene.

12. The process of claim 10 wherein said polymer comprises an acrylic or methacrylic polymer.

13. The process of claim 1 wherein said polymer is prepared by free radical polymerization.

14. The process of claim 1 wherein said polymer is prepared by group transfer polymerization.

15. The process of claim 1 wherein the irradiation is done with electrons.

16. A process for making a device or mask comprising the steps of:
   (i) forming a material on a substrate, wherein said material comprises:
      (a) a polymer chosen from the group consisting of compositions having a polymer backbone and pendant groups bound directly or indirectly to said backbone, said pendant groups represented by the formula:

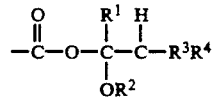

or

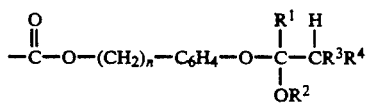

wherein:
n=0-4;
$R^1$ is hydrogen or a $C_1$-$C_6$ alkyl;
$R_2$ is a $C_1$-$C_6$ alkyl; and
$R^3$ and $R^4$ independently are hydrogen or $C_1$-$C_6$ alkyl where the definition of $C_1$-$C_6$ alkyl includes the joining of $R^1$ and $R^2$ or $R^1$ and either $R^3$ or $R^4$, or $R^2$ and either $R^3$ or $R^4$ to form a 5-, 6- or 7-membered ring; and (b) material that forms an acid upon irradiation comprising carbazole diazonium salts of the structures:

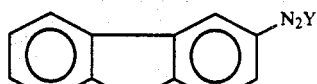

or

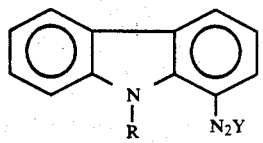

wherein:

Y is $PF_6^-$, $AsF_6^-$, $SbF_6^-$, $FeCl_4^-$, $SnCl_6^{-2}$, $SbCl_6^-$, $BF_4^-$ or $BiCl_5^{-2}$; and R is selected from the group consisting of $C_xH_{2x+1}$ where x is 1-16, benzyl, phenyl, substituted benzyl, substituted phenyl and cycloalkyl, provided, however, where $N_2Y$ is in the "1" position as in the second structure, R is not phenyl or substituted phenyl;

(ii) irradiating part of said material with actinic radiation in order to delineate a latent image of a desired pattern on the irradiated part of the material;

(iii) prebaking the irradiated material; and (iv) developing said irradiated and delineated material by means of a solvent that preferentially dissolves the irradiated material to make a visible pattern.

17. The process of claim 16 carried out at a temperature of 70° C. to 115° C.

18. A process for making a device or mask comprising the steps of:

(i) forming a material on a substrate, wherein said material comprises:

(a) a polymer chosen from the group consisting of compositions having a polymer backbone and pendant groups bound directly or indirectly to said backbone, said pendant groups represented by the formula:

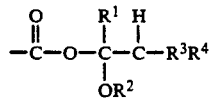

or

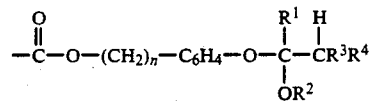

wherein:

n=0-4;

$R^1$ is hydrogen or a $C_1$-$C_6$ alkyl;

$R^2$ is a $C_1$-$C_6$ alkyl; and $R^3$ and $R^4$ independently are hydrogen or $C_1$-$C_6$ alkyl where the definition of $C_1$-$C_6$ alkyl includes the joining of $R^1$ and $R^2$ or $R^1$ and either $R^3$ or $R^4$, or $R^2$ and either $R^3$ or $R^4$ to form a 5-, 6- or 7-membered ring; and (b) material that forms an acid upon irradiation comprising carbazole diazonium salts of the structures:

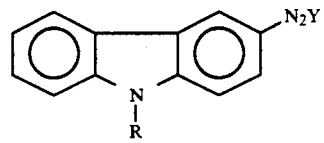

or

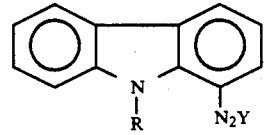

wherein:

Y is $PF_6^-$, $AsF_6^-$, $SbF_6^-$, $FeCl_4^-$, $SnCl_6^{-2}$, $SbCl_6^-$, $BF_4^-$ or $BiCl_5^{-2}$; and R is selected from the group consisting of $C_xH_{2x+1}$ where x is 1-16, benzyl, phenyl, substituted benzyl, substituted phenyl and cycloalkyl, provided, however, where $N_2Y$ is in the "1" position as in the second structure, R is not phenyl or substituted phenyl;

(ii) prebaking the material;

(iii) irradiating part of said material with actinic radiation in order to delineate a latent image of a desired pattern on the irradiated part of the material; and (iv) developing said irradiated and delineated material by means of a solvent that preferentially dissolves the irradiated material.

19. The process of claim 18 carried out a temperature of 70° C. to 115° C.

* * * * *